United States Patent
Landwehr et al.

(10) Patent No.: US 10,494,310 B2
(45) Date of Patent: Dec. 3, 2019

(54) DENSE ENVIRONMENTAL BARRIER COATINGS

(71) Applicant: Rolls-Royce Corporation, Indianapolis, IN (US)

(72) Inventors: Sean E. Landwehr, Avon, IN (US); Adam Lee Chamberlain, Mooresville, IN (US); Ann Bolcavage, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 402 days.

(21) Appl. No.: 15/265,134

(22) Filed: Sep. 14, 2016

(65) Prior Publication Data
US 2017/0073278 A1    Mar. 16, 2017

Related U.S. Application Data

(60) Provisional application No. 62/218,209, filed on Sep. 14, 2015.

(51) Int. Cl.
| | | |
|---|---|---|
| *C04B 41/86* | (2006.01) | |
| *C23C 4/134* | (2016.01) | |
| *C23C 16/44* | (2006.01) | |
| *C23C 14/22* | (2006.01) | |
| *C25D 13/02* | (2006.01) | |
| *C23C 14/06* | (2006.01) | |
| *C23C 14/32* | (2006.01) | |
| *C03C 8/02* | (2006.01) | |
| *C03C 3/091* | (2006.01) | |
| *C03C 3/093* | (2006.01) | |
| *C04B 41/50* | (2006.01) | |
| *C04B 41/00* | (2006.01) | |
| *C03C 3/064* | (2006.01) | |

(52) U.S. Cl.
CPC .............. *C04B 41/86* (2013.01); *C03C 3/064* (2013.01); *C03C 3/091* (2013.01); *C03C 3/093* (2013.01); *C03C 8/02* (2013.01); *C04B 41/009* (2013.01); *C04B 41/5022* (2013.01); *C23C 4/134* (2016.01); *C23C 14/06* (2013.01); *C23C 14/221* (2013.01); *C23C 14/325* (2013.01); *C23C 16/44* (2013.01); *C25D 13/02* (2013.01); *C03C 2209/00* (2013.01)

(58) Field of Classification Search
CPC ... C04B 41/86; C04B 41/5022; C04B 41/009; C23C 14/30; C23C 14/06
See application file for complete search history.

(56) References Cited

U.S. PATENT DOCUMENTS

| | | |
|---|---|---|
| 5,876,850 A | 3/1999 | Skowronski et al. |
| 7,968,217 B2 | 6/2011 | Sarrafi-Nour et al. |
| 8,173,206 B2 | 5/2012 | Boutwell et al. |

(Continued)

FOREIGN PATENT DOCUMENTS

JP         03221442 A   *   9/1991

*Primary Examiner* — Nathan H Empie
(74) *Attorney, Agent, or Firm* — Shumaker & Sieffert, P.A.

(57) ABSTRACT

In some examples, method including forming an EBC layer on a substrate, wherein the EBC layer exhibits an initial porosity; forming a layer of silicate glass on a surface of the EBC layer; and melting the silicate glass on the surface of the EBC layer to infiltrate the EBC layer with the molten silicate glass to decrease the porosity of the EBC layer from the initial porosity to a final porosity.

19 Claims, 3 Drawing Sheets

(56) References Cited

U.S. PATENT DOCUMENTS

| | | |
|---|---|---|
| 8,501,840 B2 | 8/2013 | Kirby et al. |
| 8,673,400 B2 | 3/2014 | Kirby et al. |
| 8,729,161 B2 | 5/2014 | Kirby et al. |
| 2006/0121293 A1* | 6/2006 | Boutwell .............. C04B 41/009 428/469 |
| 2011/0027517 A1 | 2/2011 | Kirby et al. |
| 2011/0027559 A1 | 2/2011 | Kirby et al. |
| 2014/0037969 A1 | 2/2014 | Margolies et al. |
| 2014/0134399 A1 | 5/2014 | Kirby et al. |
| 2014/0141219 A1 | 5/2014 | Kirby et al. |
| 2016/0003063 A1* | 1/2016 | Rosenzweig ......... C04B 41/009 427/397.7 |

* cited by examiner

DENSE ENVIRONMENTAL BARRIER COATINGS

This application claims the benefit of U.S. Provisional Application No. 62/218,209 filed Sep. 14, 2015, which is incorporated herein by reference in its entirety.

TECHNICAL FIELD

The disclosure relates to coatings for ceramic substrates and ceramic matrix composite substrates.

BACKGROUND

Components of high-temperature mechanical systems, such as, for example, gas-turbine engines, operate in severe environments. For example, the high-pressure turbine blades, vanes, blade tracks and blade shrouds exposed to hot gases of about 1100 degrees Celsius (C), with short-term peaks greater than about 1550 degrees C.

Components of high-temperature mechanical systems may include a ceramic substrate, or a ceramic matrix composite (CMC) substrate. Some ceramics or CMCs possess excellent high temperature mechanical, physical and chemical properties, and may allow gas turbine engines to operate at higher temperatures than gas turbine engines having superalloy components.

SUMMARY

In some examples, the disclosure relates to a method comprising forming an EBC layer on a substrate, wherein the EBC layer exhibits an initial porosity; forming a layer of silicate glass on a surface of the EBC layer; and melting the silicate glass on the surface of the EBC layer to infiltrate the EBC layer with the molten silicate glass to decrease the porosity of the EBC layer from the initial porosity to a final porosity.

In some examples, the disclosure relates to an article comprising a substrate; an EBC layer formed on the substrate, wherein the EBC layer exhibits an initial porosity; and a silicate glass formed directly on a surface of the EBC layer.

The details of one or more examples are set forth in the accompanying drawings and the description below. Other features, objects, and advantages will be apparent from the description and drawings, and from the claims.

DETAILED DESCRIPTION

Figure 1:
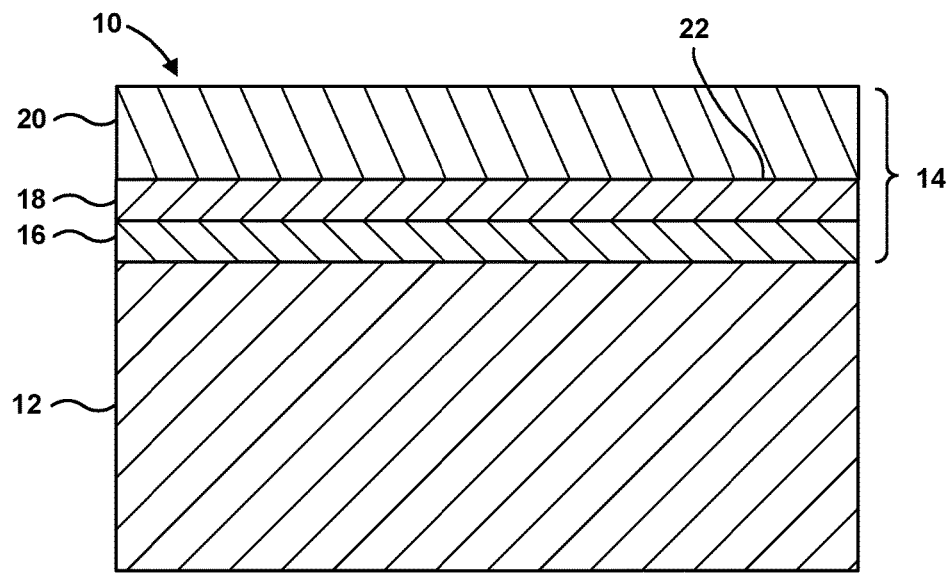
FIG. 1 is a conceptual and schematic diagram illustrating an example article including an EBC coating on a substrate.

The disclosure describes an article including a ceramic or CMC substrate coated with an EBC including a bond layer and an EBC layer, and techniques for forming those articles. In some examples, ceramic or ceramic matrix composite (CMC) substrates may include silicon or a silicon-containing material, such as silicon carbide or silicon nitride. Substrates including silicon or a silicon-containing material may be vulnerable to chemical attack, especially by water vapor. Water vapor may chemically attack a ceramic or CMC substrate including silicon to form silicon hydroxide species at the temperatures experienced by the ceramic or CMC substrate and damage the ceramic or CMC substrate.

To reduce or substantially prevent damage to the ceramic or CMC substrate, the ceramic or CMC substrate may be coated with an environmental barrier coating (EBC), which reduces or substantially prevents recession of the CMC substrate by reaction with water vapor. In some examples, the EBC is a multilayer coating including a bond layer between the substrate and an EBC layer, where the bond layer may enhance adherence of the EBC layer to the substrate. However, in some examples, the porosity of the EBC layer may allow for transport of some gaseous species (e.g., oxygen) to the ceramic or CMC substrate. In the case of oxygen, the oxidation product at operating temperature of a high temperature system component formed of the ceramic or CMC substrate may be fluid and may result in excessive formation of thermally grown oxide. The formation of such thermally grown oxide may be undesirable. For example, excessive growth of the thermally grown oxide may result in deceased bond strength of the EBC or loss of the EBC. In some cases, the excessive oxidation of the substrate may also compromise its mechanical integrity.

In accordance with one or more examples of a disclosure, example techniques may be employed to reduce the porosity and increase the density of an EBC layer following the initial formation of the EBC layer on the substrate. The reduction in porosity may reduce or substantially prevent transport of oxygen and/or other gaseous species through the EBC layer during subsequent use of the substrate as a component in a high operation temperature environment, e.g., as compared to a substrate with an EBC layer in which such example techniques have not been employed.

In one example, following the formation of an EBC layer on a substrate and bond layer, the density of the EBC layer may be increased and the porosity decreased by infiltrating pores of the EBC layer with a silicate glass, such as, e.g., borosilicate glass. The EBC layer may have an initial porosity following the formation of the layer on the bond layer and substrate. A silicate glass layer may then be formed on the top surface of the EBC layer. The temperature of the silicate glass layer may be increased to or above the melting point of the silicate glass and the molten silicate glass may infiltrate the sub-surface pores of the EBC layer. By filling the pores of the EBC layer with silicate glass using such a technique, the porosity of the EBC layer may be decreased, e.g., to less than or equal to about 5% porosity. In some examples, the molten silicate glass may also infiltrate through the EBC layer into the bond layer. In this manner, the porosity of the bond layer may also be decreased as a result of the infiltration of silicate glass following the formation of the EBC layer and improve the mechanical bond between the EBC layer and bond layer.

In some examples, the silicate glass layer formed on the EBC layer may include one or more components selected to modify the viscosity of the molten glass and/or enhance the glass chemical stability of the molten silicate glass during the infiltration process. For example, the silicate glass layer composition may include one or more components which volatize when the silicate glass is in a molten state at or above the melting temperature. As those components volatize out of the molten glass during the time period when the silicate glass composition is in a molten state, the viscosity of the molten glass is increased. In this manner, the viscosity of the molten glass may initially exhibit a relatively low viscosity when initially in the molten state, e.g., to promote infiltration into the pores of the EBC layer, followed by an increase in viscosity the longer the glass is held at or above the melting temperature as the more components volatize out of the molten glass compositions to provide for a silicate glass composition with greater viscosity and enhanced glass chemical stability (e.g., in terms of lower volatility within the pores of the EBC layer and bond layer by virtue of the decreased amount of volatile species).

In some examples, the temperature of the molten silicate glass may be kept substantially constant at or above the melting temperature while the molten glass infiltrates the pores of the EBC layer followed by cooling of the silicate glass back below the melting temperature. Alternatively, the temperature of the molten glass may be varied during the infiltration process. For example, a two-step process may be employed in which the silicate glass is initially brought to a first temperature for a period of time to allow the molten glass to infiltrate into the pores of the EBC layers followed by an increase in temperature molten glass for another period of time to volatize component(s) and/or increase the rate at which component(s) volatize out of the molten glass, thereby increasing the viscosity the molten glass infiltrated into the pores of the EBC layer.

FIG. 1 is a conceptual and schematic diagram illustrating an example article 10 including a substrate 12 and EBC coating 14. EBC coating 14 may help protect underlying substrate 12 from chemical species present in the environment in which article 10 is used, such as, e.g., water vapor, calcia-magnesia-alumina-silicate (CMAS; a contaminant that may be present in intake gases of gas turbine engines), or the like. Additionally, in some examples, EBC coating 14 may also protect substrate 12 and provide for other functions besides that of an EBC, e.g., by functioning as a thermal barrier coating (TBC), abradable coating, erosion resistant coating, and/or the like.

Substrate 12 defines a surface 20 on which EBC coating 14 is disposed. EBC coating 14 includes bond layer 16, EBC layer 18, and overlay layer 20. Although each of substrate 12, bond layer 16, EBC layer 18, and overlay layer 20 are shown as individual layers, one or more of the respective layers may be formed of a single layer or a plurality of sub-layers. Bond layer 16, EBC layer 18, and outer coating layers 38 may be applied using a variety of techniques including, for example, thermal spraying (e.g., plasma spraying), PVD, electron beam physical vapor deposition (EB-PVD), directed vapor deposition (DVD), CVD, cathodic arc deposition, slurry process deposition, sol-gel process deposition, or electrophoretic deposition.

Substrate 12 may be a component of a high temperature mechanical system. For example, substrate 12 may be a blade track, an airfoil, a blade, a combustion chamber liner, or the like. In some examples, substrate 12 include a ceramic, a ceramic matrix composite (CMC), or a metal alloy that includes Si. In some examples, substrate 12 may include a silicon based material, such as silicon based ceramic, a silicon based CMC, or a silicon based alloy.

In some examples in which substrate 12 includes a ceramic, the ceramic may be substantially homogeneous. In some examples, a substrate 12 that includes a ceramic includes, for example, a Si-containing ceramic, such as $SiO_2$, silicon carbide (SiC) or silicon nitride ($Si_3N_4$); $Al_2O_3$; or the like. In other examples, substrate 10 includes a metal alloy that includes Si, such as a molybdenum-silicon alloy (e.g., $MoSi_2$) or a niobium-silicon alloy (e.g., $NbSi_2$).

Substrate 12 may be manufactured using one or more techniques including, for example, chemical vapor deposition (CVD), chemical vapor infiltration (CVI), polymer impregnation and pyrolysis (PIP), slurry infiltration, melt infiltration (MI), combinations thereof, or other techniques.

In examples in which substrate 12 includes a CMC, substrate 12 includes a matrix material and a reinforcement material. The matrix material includes a ceramic material, such as, for example, SiC, $Si_3N_4$, $Al_2O_3$, aluminosilicate, $SiO_2$, or the like. The CMC further includes a continuous or discontinuous reinforcement material. For example, the reinforcement material may include discontinuous whiskers, platelets, or particulates. As other examples, the reinforcement material may include a continuous monofilament or multifilament weave. In some examples, the reinforcement material may include SiC, $Si_3N_4$, $Al_2O_3$, aluminosilicate, $SiO_2$, or the like. In some examples, substrate 12 includes a SiC—SiC ceramic matrix composite.

Bond layer 16 may be between EBC layer 18 and substrate 12, and may increase the adhesion of EBC layer 18 to substrate 12. In some examples, bond layer 18 may include silicon and take the form of a silicon bond layer. Bond layer 16 may be in direct contact with substrate 12 and EBC layer 12. In some examples, bond layer 16 has a thickness of approximately 25 microns to approximately 250 microns, although other thicknesses are contemplated.

EBC layer 18 may include constituents and a physical construction selected to reduce contact of underlying layers with chemical species present in the environment in which article 10 is used, such as water vapor, calcia-magnesia-alumina-silicate (CMAS; a contaminant that may be present in intake gases of gas turbine engines), or the like. EBC layer 18 may include at least one of a rare earth oxide, a rare earth silicate, an aluminosilicate, or an alkaline earth aluminosilicate. For example, EBC layer 18 may include at least one rare earth monosilicate ($RE_2SiO_5$, where RE is a rare earth element), at least one rare earth disilicate ($RE_2Si_2O_7$, where RE is a rare earth element), or combinations thereof. In some examples, EBC layer 18 may include an additive in addition to the primary constituents of EBC layer 18. For example, EBC layer 18 may include at least one of TiO2, Ta2O5, HfSiO4, an alkali metal oxide, or an alkali earth metal oxide. The additive may be added to EBC layer 18 to modify one or more desired properties of EBC 32. In some examples, EBC layer 18 may have a thickness of approximately 25 microns to approximately 250 microns, although other values are contemplated.

EBC layer 18 may also include a glass silicate within pores (not shown) of EBC layer 18. As described herein, following the initial formation of EBC layer 18, a glass silicate layer (not shown) may be formed on surface 22 of EBC layer 18 and then melted to infiltrate open pores of EBC layer 18. In this manner, the porosity of EBC layer 18 may be decreased from that of the porosity of EBC layer 18 prior to infiltration with the molted silicate glass. In some examples, following infiltration with the silicate glass, EBC layer 18 may exhibit a porosity of approximately 10 percent or less, such as, e.g., approximately 5 percent or less. In some examples, while there remains open porosity within EBC layer 18, the coating may exhibit a substantially closed porosity at the upper surface and/or other outer surfaces of EBC layer 18. Conversely, prior to infiltration with the molten silicate glass, EBC layer 18 may exhibit a porosity of greater than approximately 10 percent, such as, e.g., approximately 10 percent to approximately 20 percent, approximately 10 percent to approximately 15 percent, greater than approximately 15 percent or greater than approximately 20 percent. In some examples, the molten silicate glass may infiltrate through the pores of EBC layer 18 into bond layer 16. The presence of the molten silicate glass in the bond layer 16 from the infiltration process may increase the adhesion between bond layer 16 and EBC layer 18.

Any suitable silicate glass composition may be employed. For example, the glass composition may be a borosilicate glass composition including boron oxide (e.g., $B_2O_3$) and silicon oxide (e.g., $SiO_2$). In one example, the borosilicate glass composition may include approximately 5 atomic percent to approximately 30 atomic percent boron oxide and approximately 70 atomic percent to approximately 95 atomic percent silicon dioxide.

In some examples, the borosilicate glass composition or other silicate glass composition may include one or more additional constituents. For example, a silicate glass composition may include aluminum oxide ($Al_2O_3$) (e.g., to form a aluminoborosilicate glass composition). In some examples, one more constituents may be present to modify one more properties of the glass composition. For examples, sodium, calcium, and/or magnesium may be present (e.g., as $Na_2O$, CaO, and MgO, respectively) in the silicate glass composition, e.g., to modify the viscosity of the molten silicate glass. Such additives may work by interrupting the Si—O bonding network of the glass. Essentially any alkaline and alkali earth metals may be used modify the viscosity. In some examples, on an atomic percent basis, less alkaline is needed over alkali metals, but at the sacrifice of chemical inertness. In some examples, zirconium may be present (e.g., as $ZrO_2$) in the silicate glass composition, e.g., to enhance glass chemical stability. In some examples, tungsten may be present (e.g., as $WO_3$) in the silicate glass composition, e.g., to stabilize the boron oxide in the glass composition. In some examples, transition metal additives may have the effects of forming more stable glasses. Example may include Fe with $P_2O_5$, Zr with $SiO_2$, and $WO_3$ with $B_2O_3$. Other examples are contemplated.

Overlying layer 20 may optionally be included to provide one or more additional functions to EBC coating 14. For examples, overlying layer 20 may allow EBC coating 14 to also function as one of more of a thermal barrier coating (TBC), a calcia-magnesia-aluminosilicate (CMAS)-resistant layer, abradable coating, erosion resistance coating, abradability or the like. In some examples, overlying layer 20 may include a rare earth oxide, a rare earth silicate, an aluminosilicate, or an alkaline earth aluminosilicate. For example, overlying layer 20 may include at least one rare earth monosilicate ($RE_2SiO_5$, where RE is a rare earth element), at least one rare earth disilicate ($RE_2Si_2O_7$, where RE is a rare earth element), or combinations thereof. In some examples, overlying layer 20 may include an additive in addition to the primary constituents of overlying layer 20. For example, overlying layer 20 may include at least one of $TiO_2$, $Ta_2O_5$, $HfSiO_4$, an alkali metal oxide, or an alkali earth metal oxide. The additive may be added to EBC layer 18 to modify one or more desired properties of EBC 32. Overlying layer 20 may have a porosity of approximately 10 percent to approximately 60 percent, and a thickness of approximately 25 microns to approximately 1000 microns, although other values are contemplated.

Figure 2:
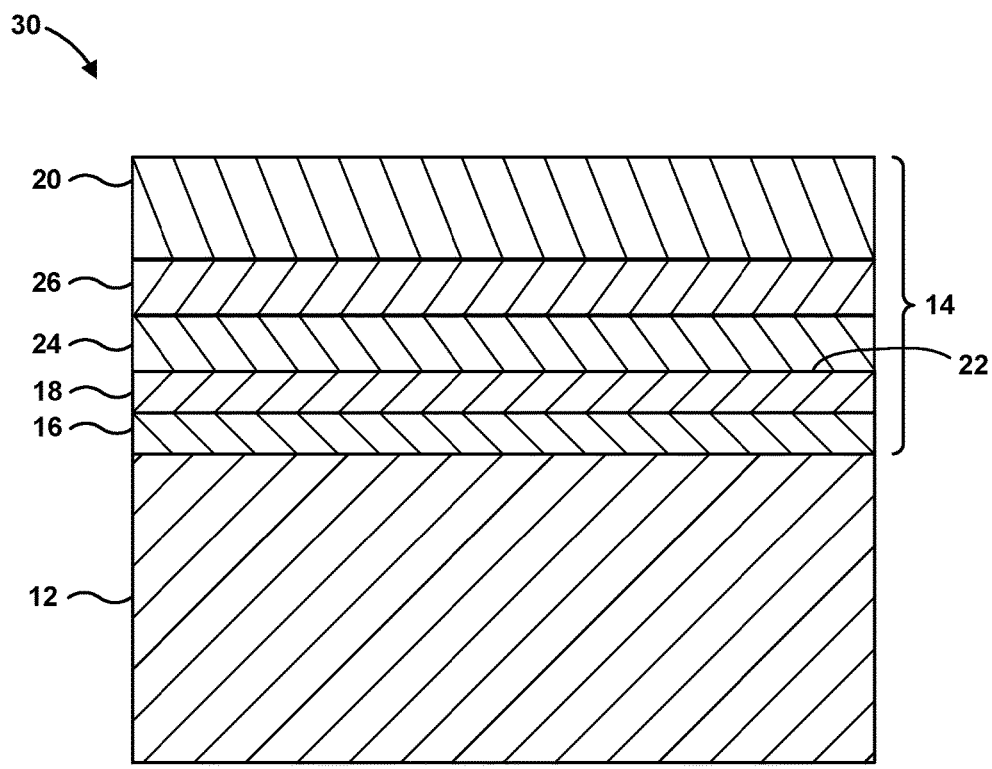
FIG. 2 is a conceptual and schematic diagram illustrating another example article including an EBC coating on a substrate.

FIG. 2 is another conceptual and schematic diagram illustrating another example article 30 including a substrate 12 and EBC coating 14. Substrate 12 and EBC coating 14 may be the same or substantially similar to that described with regard to article 10 of FIG. 1. However, as shown in FIG. 2, article 30 includes second EBC layer 24 and debond layer 26 between EBC layer 18 and overlay layer 20. Like that of article 10, EBC layer 18 and bond layer 16 may be infiltrated with molten silicate glass following the formation of EBC layer 18 to decrease the porosity of the layers from that of the initial porosity in the manner described herein.

In article 30 of FIG. 2, second EBC layer 24 may be optionally included, e.g., on surface 22 of EBC layer 18. EBC layer 24 may be formed of a composition that provides environmental protection to substrate 12 as described with regard to EBC layer 18. Second EBC layer 24 may be formed on EBC layer 18 after the porosity of EBC layer 18 has been reduced by infiltration EBC layer 18 with silicate glass. However, unlike that of EBC layer 18, second EBC layer 24 may not be subjected to infiltration of molten silicate glass following the formation of second layer 24. As such, in some examples, the porosity of second EBC layer 24 may be greater than the porosity of EBC layer 18. In some examples, the porosity of second EBC layer 24 may be substantially the same as the porosity of EBC layer 18 prior to infiltration of silicate glass into the pores of EBC layer 18. Second EBC layer 24 may have a porosity of approximately 10 percent to approximately 15 percent, although other values are contemplated. Second EBC layer 24 may have a thickness of approximately 25 microns to approximately 500 microns, although other values are contemplated. Second EBC layer 24 may have the same or different composition of EBC layer 18, e.g., the same or different composition of EBC layer 18 prior to or after infiltration of molten silicate glass into EBC layer 18 using the techniques described herein. In some example, if a vertical crack forms in second EBC layer 24, the higher density of EBC layer 16 may serve to prevent the crack from propagating further towards substrate 12.

In article 30 of FIG. 2, debond layer 26 may be optionally included, e.g., between second EBC layer 24 and overlying layer 20. Debond layer 26 may be included in order to mitigate complete loss of EBC layer 18 if crack are formed, e.g., in that overlying layer 20 may only fail rather than the remaining layers of coating 14. Debond layer 16 may additionally or alternatively reduce the risk of vertical cracks propagating to substrate 12. Vertical cracks that reach substrate 12 may provide an ingress path to oxygen or other species in the operating environment of article 30. In some examples, debond layer 26 may have a porosity of approximately 40 percent to approximately 70 percent, and a thickness of approximately 25 microns to approximately 500 microns, although other values are contemplated. The composition of debond layer 26 may be chemically compatible with second EBC layer 24 and/or EBC layer 18, e.g., debond layer 26 may have a composition substantially similar to the composition of second EBC layer 24 and/or EBC layer 18 with a relatively higher porosity to provide for the desired functionality.

FIGS. 1 and 2 illustrate various example multilayer coating composition including EBC layer 18 which has an increased density as a result of infiltration of silicate glass into the porosity in the manner described herein. In another example, coating 14 may be formed on substrate 12 and may include bond layer 16 directly on substrate 12, EBC layer 18 directly on bond layer 16, debond layer 26 directly on EBC layer 18, and overlying (e.g., abradable) layer 20 directly on debond layer 26. Other layer configurations for coating 14 are contemplated.

Figure 3:
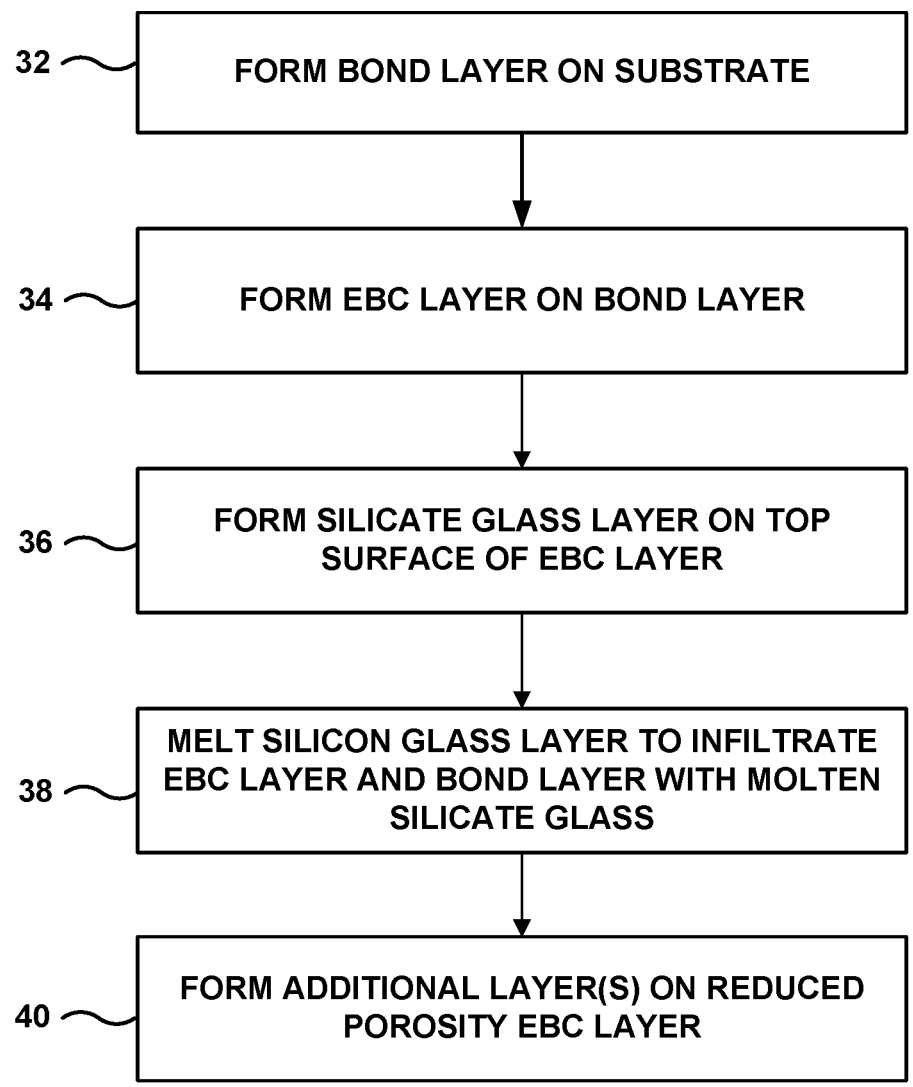
FIG. 3 is a flow diagram illustrating an example technique for forming an EBC coating on a substrate.

FIG. 3 is a flow diagram illustrating an example technique for decreasing the porosity of an EBC layer (such as, e.g., EBC layer 18) via infiltration of a silicate glass into the pores of the EBC layer. The technique of FIG. 2 will be described with concurrent reference to article 10 of FIG. 1 and article 30 of FIG. 2, although the example technique of FIG. 3 may be used to form different articles, and article 10 of FIG. 1 and article 30 may be formed using a different technique.

As shown in FIG. 3, bond layer 16 may be formed on the surface of substrate 12 (32). In some examples, bond layer 16 may be deposited on the surface of substrate 12 using plasma spraying, PVD, CVD, or other suitable technique. Subsequently, EBC layer 18 may be initially formed on the surface of bond layer 16 using thermal spraying (e.g., plasma spraying), slurry process deposition, or other suitable technique (34).

As described herein, when first formed, EBC layer 18 may exhibit an initial porosity that may be subsequently decreased by infiltration of molten silicate glass into the pores (e.g., sub-surface pores). As shown, following formation of EBC layer 18, a silicate glass layer may be formed on surface 22 of EBC layer 18 (36). The thickness of the formed silicate glass layer may be selected based on the initial porosity of EBC layer 18 prior to infiltration and the final porosity/residual porosity desired in EBC layer 18 after infiltration of the glass silicate. In some examples, the silicate glass layer may have a thickness of approximately 10 microns to approximately 400 microns or approximately 10 mils to approximately 15 mils. The glass applied to surface 22 may be melted prior to being applied to EBC layer 18, e.g., in order to provide a homogenized frit, or applied using a blended powder, e.g., that provides the appropriate level of boron oxide and silicon dioxide and/or other constituents that make up the overall composition of the silicate glass. In some examples, the glass silicate may be applied to surface 22 using sol-gel, slurry deposition, solution spray, air plasma spray, or any other suitable techniques.

Once the glass silicate has been applied to surface 22 of EBC layer 18, the system (including the applied silicate glass) may be heated, e.g., in a furnace, such that the temperature of the applied silicate glass composition reaches or exceeds the melting temperature for the particular composition and the molten silicate glass infiltrates into the sub-surface pores of EBC layer 18. The infiltration of the molten silicate glass may be caused via capillary action. In some examples, at least a portion of the process may be performed in an oxidizing atmosphere to avoid unwanted reduction of some of the chemical species. The molten silicate glass may be held at or above the temperature at which the molten silicate glass infiltrates into the sub-surface pores until the amount of infiltration provides for a desired increase in porosity of EBC layer 18 (and bond layer 16 in some examples). The temperature of the silicate glass may then be lowered to solidify the silicate glass composition, e.g., within the pores of EBC layer 18 and bond layer 16. In this manner, the porosity of EBC layer 18 may be decreased from that prior to infiltration of the silicate glass to a desired final porosity following infiltration of the silicate glass, e.g., consistent with those initial and final porosities described herein.

In some examples, the temperature of the molten silicate glass composition during infiltration of the EBC layer 18 may be substantially constant while the molten glass infiltrates EBC layer 18 while in other examples the temperature of the molten silicate glass composition during infiltration of the EBC layer 18 may vary. In each example, the temperature of the molten silicate glass composition may be such that one or more constituents of the glass composition volatizes out of the glass. The amount of volatilization may be controlled by the temperature of the molten glass composition and/or the length of time at which the glass composition is held at the elevated temperature during infiltration. In this manner, the viscosity of the molten glass composition initially may be relatively low to promote infiltration of the molten glass into the pores of EBC layer 18, e.g., via capillary action. Subsequently, one or more constituents of the molten glass composition may volatize at the elevated temperature causing the viscosity of the molten glass composition to increase and prevent or reduce flow of the infiltrated molten glass out of the pores of EBC layer 18. In some examples, a multi-step process may be employed in which the temperature of the molten glass silicate is initially set for a time period to allow for infiltration at a relatively low viscosity into EBC layer 18 followed by an increase in temperature to volatize one or more constituents in the molten glass compositions which serve to reduce the viscosity, thereby increasing the viscosity of the molten glass within the pores of EBC layer 18.

Once the porosity of EBC layer 18 (and bond layer 16, in some examples) has been decreased to a desired level via the glass infiltration process, one or more additional layers may be formed on surface 22 of EBC layer 20 (40). For example, as shown in FIG. 1, overlying layer 20 may be formed on surface 22 of EBC layer 18. As another example, as shown in FIG. 2, second EBC layer 24, debond layer 26, and overlying layer 20 may be formed on surface 22 of EBC layer 18.

EXAMPLES

First and second example silicate glass compositions that may be used to infiltrate an EBC layer to decrease the porosity of the EBC layer as described herein are listed in Table 1 and Table 2, respectively:

TABLE 1

| Example 1 (wt %) | | |
| --- | --- | --- |
| Constituent | Initial | Volatilized |
| $SiO_2$ | 55.5 | 80.75 |
| $B_2O_3$ | 30 | 5 |
| $Al_2O_3$ | 10 | 10 |
| $Na_2O$ | 0.5 | 0.25 |
| MgO | 2 | 2 |
| CaO | 2 | 2 |

TABLE 2

| Example 2 (wt %) | | |
| --- | --- | --- |
| Constituent | Initial | Volatilized |
| $SiO_2$ | 35 | 50.5 |
| $B_2O_3$ | 30 | 15 |
| $Al_2O_3$ | 10 | 10 |
| $Na_2O$ | 1 | 0.5 |
| MgO | 2 | 2 |
| CaO | 2 | 2 |
| $ZrO_2$ | 5 | 5 |
| $WO_3$ | 15 | 15 |

Example 1 represents an aluminoborosilicate glass with sodium calcium and magnesium additions to modify viscosity further. Example 2 is a similar composition but also includes zirconium to enhance glass chemical stability and tungsten additions to stabilize the boron oxide in the glass.

In each example composition, there is an initial composition quoted and then a volatilized composition which forms with extended hold at 1350 degrees Celsius or higher, during which sodium and boron were removed, resulting in a more viscous and stable glass.

Figure 4:
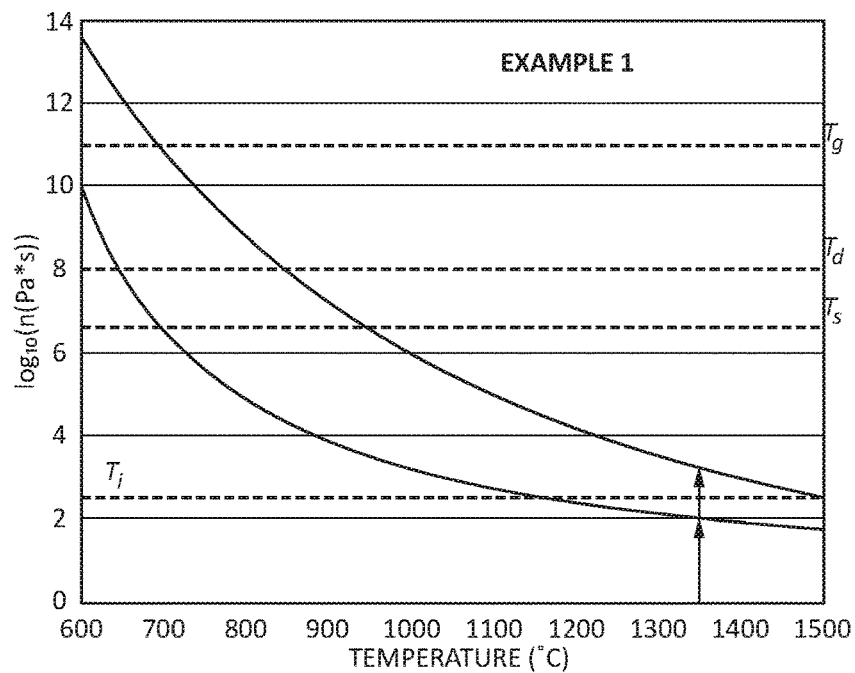
FIGS. 4 and 5 are plots of viscosity versus temperatures curves for two example silicate glass compositions which may be employed in examples of the disclosure.
Figure 5:
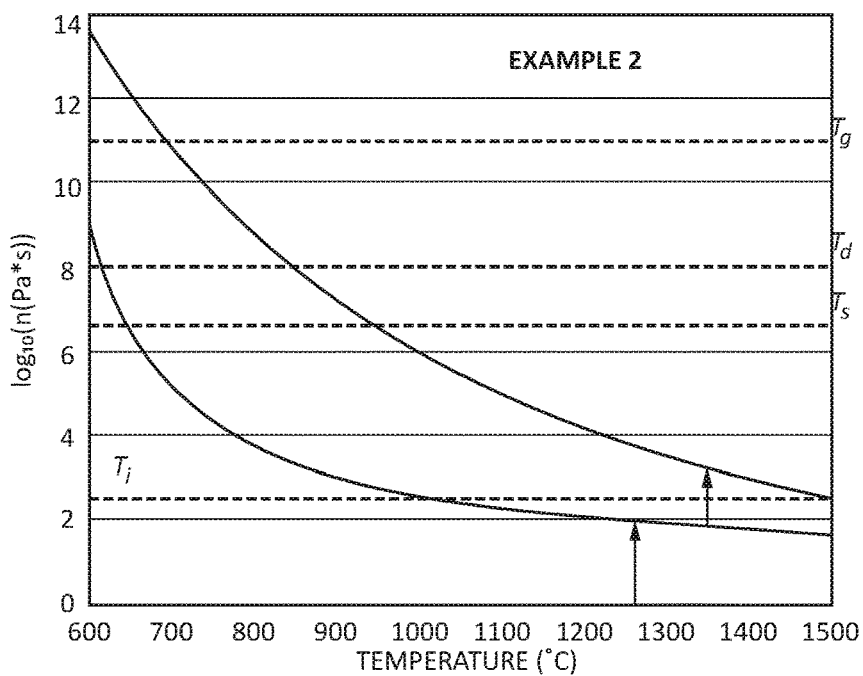

FIGS. 4 and 5 are example viscosity versus temperature curves modeled for example glass composition 1 (FIG. 4) and glass composition 2 (FIG. 5). In the graphs, the lower lines in the plot represent the viscosity of the initial composition and the upper line in the plot represents the viscosity of the composition after the boron and sodium were removed from the composition. The horizontal dashed lines represent the glass transition temperature ($T_g$), dilatometric softening point ($T_d$), Littleton softening point ($T_s$), and infiltration point ($T_i$). In Example 1 (FIG. 4), the glass composition was heated to 1350 degrees Celsius for infiltration and held at 1350 degrees Celsius to volatilize boron and sodium. In Example 2 (FIG. 5), the glass was heated to 1250 degrees Celsius for infiltration and then held at 1350 degrees Celsius to volatilize boron and sodium. These heat treatment paths are denoted by arrows in the figures.

Various examples have been described. These and other examples are within the scope of the following claims.

The invention claimed is:

1. A method comprising:
   forming an environmental barrier coating (EBC) layer on a substrate, wherein the EBC layer exhibits an initial porosity;
   forming a layer of silicate glass on a surface of the EBC layer; and
   melting the silicate glass on the surface of the EBC layer to infiltrate the EBC layer with the molten silicate glass to decrease the porosity of the EBC layer from the initial porosity to a final porosity, wherein melting the silicate glass includes heating the silicate glass over a period of time to melt the layer of silicate glass and volatize one or more components of the silicate glass.

2. The method of claim 1, wherein the silicate glass includes borosilicate.

3. The method of claim 1, wherein the viscosity of the molten silicate glass decreases over the period of time due to volatization of the one or more components of the silicate glass.

4. The method of claim 1, wherein the final porosity of the EBC layer is less than or equal to approximately 5 percent.

5. The method of claim 1, wherein the initial porosity of the EBC layer is approximately 10 percent to 20 percent.

6. The method of claim 1, further comprising forming a silicon bond layer on the substrate, wherein forming the EBC layer on the substrate comprises forming the EBC layer on the silicon bond layer such that the silicon bond layer is between the substrate and EBC layer, wherein melting the silicate glass on the surface of the EBC layer to infiltrate the EBC layer with the molten silicate glass includes melting the silicate glass on the surface of the EBC layer to infiltrate the bond layer with the molten silicate glass, wherein the infiltration of the bond layer with the molten silicate glass decreases a porosity of the bond layer.

7. The method of claim 1, wherein the substrate includes a ceramic substrate or ceramic matrix composite substrate.

8. The method of claim 1, wherein the EBC layer comprises a first EBC layer, the method further comprising forming a second EBC layer on the first EBC layer after infiltrating the first EBC layer with the molten silicate glass to decrease the porosity of the first EBC layer from the initial porosity to a final porosity.

9. The method of claim 8, wherein the second EBC layer exhibits a porosity greater than the final porosity of the first EBC layer.

10. The method of claim 1, wherein the EBC layer comprises a first EBC layer, the method further comprising forming a debond layer on the first EBC layer after infiltrating the first EBC layer with the molten silicate glass to decrease the porosity of the first EBC layer from the initial porosity to a final porosity, wherein the debond layer prevents cracking from one or more subsequent layers formed on the debond layer to propagate to the first EBC layer to prevent failure of the first EBC layer.

11. A method comprising:
    forming an environmental barrier coating (EBC) layer on a substrate, wherein the EBC layer exhibits an initial porosity;
    forming a layer of silicate glass on a surface of the EBC layer, wherein the silicate glass includes borosilicate; and
    melting the silicate glass on the surface of the EBC layer to infiltrate the EBC layer with the molten silicate glass to decrease the porosity of the EBC layer from the initial porosity to a final porosity.

12. The method of claim 11, wherein melting the silicate glass includes heating the silicate glass over a period of time to melt the layer of silicate glass and volatize one or more components of the silicate glass.

13. The method of claim 11, wherein the final porosity of the EBC layer is less than or equal to approximately 5 percent, and the initial porosity of the EBC layer is approximately 10 percent to 20 percent.

14. The method of claim 11, further comprising forming a silicon bond layer on the substrate, wherein forming the EBC layer on the substrate comprises forming the EBC layer on the silicon bond layer such that the silicon bond layer is between the substrate and EBC layer, wherein melting the silicate glass on the surface of the EBC layer to infiltrate the EBC layer with the molten silicate glass includes melting the silicate glass on the surface of the EBC layer to infiltrate the bond layer with the molten silicate glass, wherein the infiltration of the bond layer with the molten silicate glass decreases a porosity of the bond layer.

15. The method of claim 11, wherein the substrate includes a ceramic substrate or ceramic matrix composite substrate.

16. A method comprising:
    forming a silicon bond layer on a substrate;
    forming an environmental barrier coating (EBC) layer on the silicon bond layer, wherein the EBC layer exhibits an initial porosity;
    forming a layer of silicate glass on a surface of the EBC layer, and
    melting the silicate glass on the surface of the EBC layer to infiltrate the EBC layer with the molten silicate glass to decrease the porosity of the EBC layer from the initial porosity to a final porosity, wherein melting the silicate glass on the surface of the EBC layer to infiltrate the EBC layer with the molten silicate glass includes melting the silicate glass on the surface of the EBC layer to infiltrate the bond layer with the molten silicate glass, wherein the infiltration of the bond layer with the molten silicate glass decreases a porosity of the bond layer.

17. The method of claim 16, wherein melting the silicate glass includes heating the silicate glass over a period of time to melt the silicate glass layer and volatize one or more components of the silicate glass.

18. The method of claim 16, wherein the final porosity of the EBC layer is less than or equal to approximately 5 percent, and the initial porosity of the EBC layer is approximately 10 percent to 20 percent.

19. The method of claim 16, wherein the substrate includes a ceramic substrate or ceramic matrix composite substrate.

* * * * *